United States Patent
Shih et al.

(10) Patent No.: US 9,874,589 B2
(45) Date of Patent: Jan. 23, 2018

(54) INRUSH CURRENT RECORDING MODULE

(71) Applicant: ZIPPY TECHNOLOGY CORP., New Taipei (TW)

(72) Inventors: Tsun-Te Shih, New Taipei (TW); Yu-Yuan Chang, New Taipei (TW); Kuang-Lung Shih, New Taipei (TW); Wen-Lung Li, New Taipei (TW); Heng-Chia Chang, New Taipei (TW)

(73) Assignee: ZIPPY TECHNOLOGY CORP., New Taipei (TW)

( * ) Notice: Subject to any disclaimer, the term of this patent is extended or adjusted under 35 U.S.C. 154(b) by 80 days.

(21) Appl. No.: 14/939,400

(22) Filed: Nov. 12, 2015

(65) Prior Publication Data

US 2017/0138989 A1    May 18, 2017

(51) Int. Cl.
  *G01R 13/04*    (2006.01)
  *G01R 19/00*    (2006.01)

(52) U.S. Cl.
  CPC .................... *G01R 19/0092* (2013.01)

(58) Field of Classification Search
  CPC .. H02M 1/32; H02M 3/33507; H02M 1/4225; H02M 1/36; H02M 2001/0058; H02M 3/156; H02M 2001/0096; H02M 2001/0025; H02M 3/33546; H02M 3/3376; H02M 7/062; H02M 1/083; H02M 1/14; H02M 1/44; H02M 2001/0032; H02M 2001/0054; H02M 2001/007; H02M 2001/008; H02M 3/1563; H02M 3/33569; H02M 3/337; H02M 5/458; H02M 7/12; H02M 1/08; H02M 2001/0022;

(Continued)

(56) References Cited

U.S. PATENT DOCUMENTS

| 4,494,064 A | * | 1/1985 | Harkness | ............... H02H 9/001 323/277 |
| 5,283,707 A | * | 2/1994 | Conners | ................. H02H 9/001 323/908 |

(Continued)

FOREIGN PATENT DOCUMENTS

| TW | I367624 | 7/2012 |
| TW | 201526487 | 7/2015 |
| TW | I494747 | 8/2015 |

*Primary Examiner* — Vinh Nguyen
(74) *Attorney, Agent, or Firm* — Muncy, Geissler, Olds & Lowe, P.C.

(57) ABSTRACT

An inrush current recording module is installed in a power supply unit. The power supply unit has a front-stage power circuit and a back-stage power circuit. The front-stage power circuit includes a first ground terminal, and the back-stage power circuit includes a second ground terminal. The inrush current recording module includes a series circuit and a detection recording unit. The series circuit is formed by a capacitor and a resistor, and includes two ends thereof respectively connected to the first ground terminal and the second ground terminal. The detection recording unit detects the resistor to generate a voltage signal, compares the voltage signal with a voltage determination level, starts timing an inspection period when the voltage signal is greater than the voltage determination level, and records whether a current inrush current is harmful or harmless according to whether a power output signal is obtained within the inspection period.

10 Claims, 5 Drawing Sheets

(58) Field of Classification Search
CPC .. H02M 3/155; H02M 3/158; H02M 3/33561; H02M 5/42; H02M 7/2176; H02M 7/483; G06F 1/3287; G06F 1/206; G06F 1/324; G06F 1/329; G06F 9/44505; G06F 1/26; G06F 1/28; H02H 7/04; H02H 9/002; H02H 9/001; H02H 1/0015; H02H 1/43; H02H 1/043; H02H 1/06; H02H 3/10; H02H 3/105; H02H 3/334; H02H 5/083; H02H 1/0092; H02H 3/00; H02H 3/05; H02H 3/52; H02H 5/04; H02H 7/0811; G05B 15/02

See application file for complete search history.

(56) References Cited

U.S. PATENT DOCUMENTS

| | | | | |
|---|---|---|---|---|
| 6,150,800 | A * | 11/2000 | Kinoshita | G05F 1/573 323/274 |
| 7,642,677 | B2 * | 1/2010 | Harris | H02H 9/001 307/131 |
| 2013/0264879 | A1 * | 10/2013 | Shih | H02J 9/005 307/66 |

* cited by examiner

INRUSH CURRENT RECORDING MODULE

FIELD OF THE INVENTION

The present invention relates to an inrush current recording module, and particularly to an inrush current recording module installed in a power supply unit.

BACKGROUND OF THE INVENTION

An inrush current, also referred to as a surge current, is a current generated from an instantaneous surge voltage entering a power device (e.g., a power supply unit) from an external power source. There are various reasons that may cause the inrush current, e.g., switching between power grids, an instant of activating or suspending the power supply unit, or a power grid struck by lightning. The inrush current is frequently greater than a maximum tolerable current of circuits forming the power supply unit, such that the power supply unit becomes abnormal or even elements in the power supply unit may be damaged. Further, the inrush current occurs about 60 times per year.

In view of the above, many manufacturers of power supply units have developed various different technologies for solving issues of the inrush current, e.g., the Taiwan Patent Publication No. 201526487, the Taiwan Patent No. 1367624, and the Taiwan Patent No. 1494747. However, although the above disclosures provide suppression or protection to a certain level against the inrush current, the inrush current is not categorized or recorded. As such, when the current change incurred by the inrush current causes damage on the power supply unit and the power supply unit becomes malfunctioning, the consumer or user of the power supply unit inevitably holds a manufacturer of the power supply unit responsible for such unsatisfactory product. Thus, the manufacturer of the power supply unit may receive an undeserved blame, in a way that the reputation is jeopardized or additional maintenance costs are resulted.

SUMMARY OF THE INVENTION

The primary object of the present invention provide a solution for issues of the prior art in which an inrush current is not categorized or recorded.

To achieve the above object, the present invention provides an inrush current recording module installed in a power supply unit. The power supply unit includes a transformer, and includes a front-stage power circuit and a back-stage power circuit that are divided by the transformer. The front-stage power circuit includes a first ground terminal. The back-stage power circuit includes a second ground terminal different from the first ground terminal. The power supply unit generates a power output signal when supplying power in a normal condition. The inrush current recording module includes a series circuit and a detection recording unit. The series circuit is formed by a capacitor and a resistor, and includes two ends thereof respectively connected to the first ground terminal and the second ground terminal. The detection recording unit detects voltages at two nodes of the resistor to generate a voltage signal, and is predetermined with a voltage determination level for comparing with the voltage signal, and an inspection period having a timing starting point as a time point at which the voltage signal is greater than the voltage determination level. The detection recording unit records a harmful inrush current when the power output signal is not obtained before the inspection period ends, and records a harmless inrush current when the power output signal is obtained after the inspection period ends.

In one embodiment, the back-stage power circuit of the power supply unit includes a first power path that provides at least one operating power and a second power path that provides a standing power. The inrush current recording module is connected to the second power path to obtain the standing power for operations. The inrush current recording module further includes an energy storage capacitor. The energy storage capacitor has a charging status in which the energy storage capacitor obtains the standing power, and a discharging status in which the energy storage capacitor is unable to obtain the standing power and outputs power to the detection recording unit.

In one embodiment, the inrush current recording module includes a one-directional conducting element connected to the second power path.

In one embodiment, the capacitor includes two ends thereof respectively connected to the first ground terminal and the resistor, and the resistor includes two ends thereof respectively connected to the second ground terminal and the capacitor.

In one embodiment, the detection recording unit includes two detection circuits each connected to one end of the resistor, and a first signal receiving circuit that obtains the power output signal.

In one embodiment, the power supply unit receives a power-on signal from an external device to become activated and to supply power. The detection recording unit has an enable condition of recording only when the power-on signal is obtained. Further, the detection recording unit includes a second signal receiving circuit that receives the power-on signal.

With the above embodiments of the present invention, the present invention provides following features compared to a conventional solution.

The inrush current recording module of the present invention includes a series circuit and a detection recording unit. The series circuit is formed by a capacitor and a resistor, and includes two ends thereof respectively connected to the first ground terminal and the second ground terminal. The detection recording unit detects the resistor to generate a voltage signal, and compares the voltage signal with the voltage determination level. When the voltage signal is greater than the voltage determination level, the detection recording unit starts timing an inspection period, and records a harmful inrush current or a harmless inrush current according to whether a power output signal is obtained within the inspection period. Accordingly, recorded results of the detection recording unit can be later read by maintenance staff to determine whether a malfunction of the power supply unit is caused by the harmful inrush current.

DETAILED DESCRIPTION OF THE PREFERRED EMBODIMENTS

Details and technical contents of the present invention are given with the accompanying drawings below.

Figure 1:
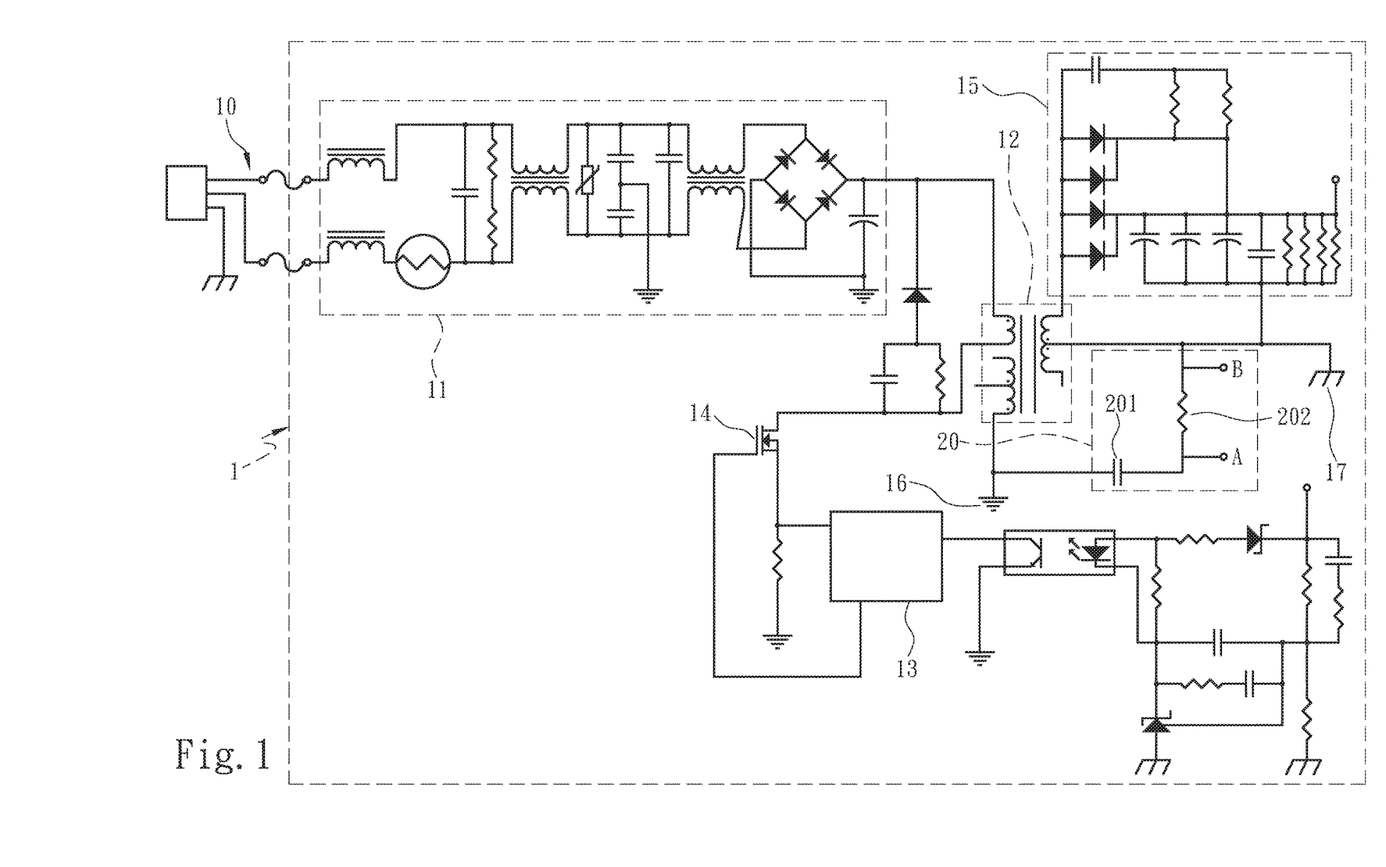
FIG. 1 is a schematic diagram of circuits forming a power supply unit according to an embodiment of the present invention.

Referring to FIG. 1, the present invention provides an inrush current recording module installed in a power supply unit 1. More specifically, the inrush current recording module is installed in the power supply unit through an auxiliary circuit board, or is established in a component circuit of the power supply unit 1. The inrush current recording module is applicable to the power supply unit 1 implemented in various forms. For better illustrations, for example but not limited to, one of these implementation forms is given in an embodiment. In one embodiment, the power supply unit 1 at least includes a power factor correction unit 11, a transformer 12, a pulse width control unit 13, a switch element 14 and a power output unit 15. When the power supply unit 1 is activated, the power factor correction unit 11 obtains an alternating current provided by an external power source 10, performs rectification conversion and power factor adjustment on the alternating current to generate a direct current, and outputs the direct current to the primary side of the transformer 12. The pulse width control unit 13 outputs a pulse width modulation (PWM) signal to the switch element 14, such that the switch element 14 is controlled by the PWM signal to cause the switch element 14 to be correspondingly turned on/off. The turning on/off of the switch element 14 determines the turning on/off of the primary side of the transformer 12. When the switch element 14 is turned on, the primary side of the transformer 12 is turned on, and magnetic induction is generated at the secondary side of the transformer 12 to further transform and output the direct current to the power output unit 15. At this point, the power output unit 15 directly outputs the direct current or again transforms the direction current to supply at least one operating power or a standing power to an external device. Further, the external device may be a motherboard or other electronic devices. The power outputted by the power output unit 15 is constructed according to Advanced Technology Extended (ATX) motherboard specifications. In other words, the operating power may be 12 Vdc, 5 Vdc or 3.3 Vcd in the ATX motherboard specifications, and the standing power may be 5 Vsb in the ATX motherboard specifications.

Further, the power supply unit 1 is divided into a front-stage power circuit and a back-stage power circuit by the transformer 12. In simple, the front-stage power circuit is the part formed by circuits from the power factor correction unit 11 to the transformer 12 among the circuits forming the power supply unit 1, and the power factor correction unit 11 is the part formed by circuits from the secondary side of the transformer 12 to the power output unit 15 among the circuits forming the power supply unit 1. Further, the front-stage power circuit includes a first ground terminal 16, and the back-stage power circuit includes a second ground terminal 17. The first ground terminal 16 is different from the second ground terminal 17. When the power supply unit 1 provides power in a normal condition, the power supply unit 1 generates a power output signal Power_good (or referred to as Vout), which is also transmitted to the external device. The external device utilizes the power output signal Power_good as a reference for determining whether the power supply unit 1 provides a normal power supply.

Figure 2:
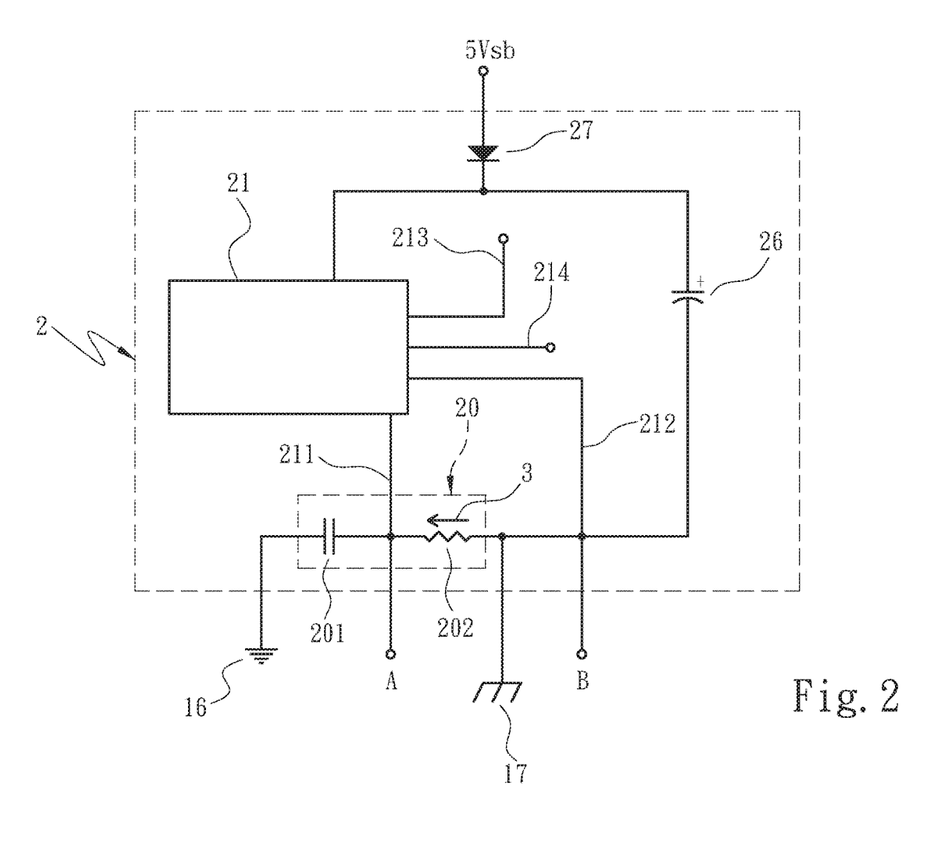
FIG. 2 is a schematic diagram of an inrush current recording module according to an embodiment of the present invention.
Figure 3:
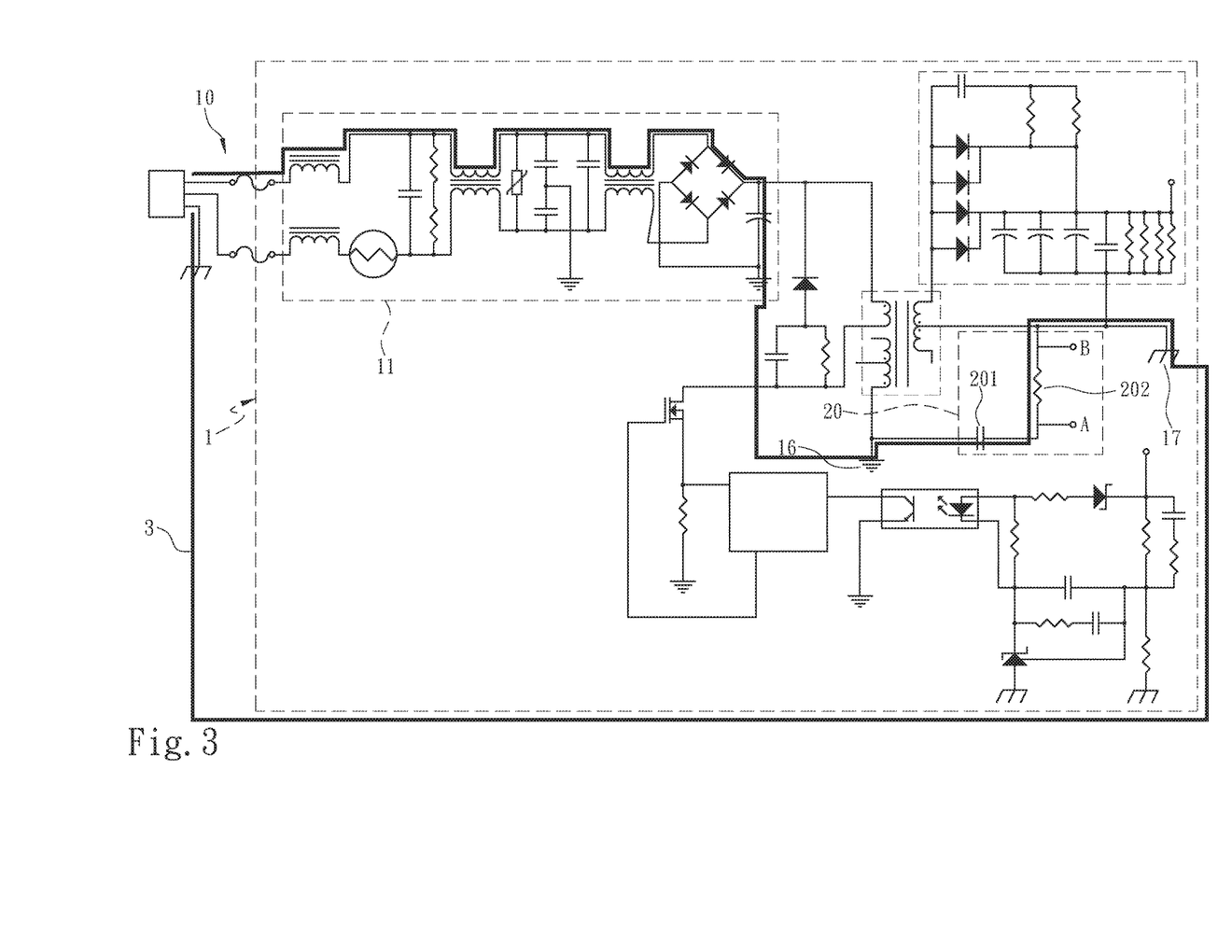
FIG. 3 is a schematic diagram of an inrush current according to an embodiment of the present invention.
Figure 4:
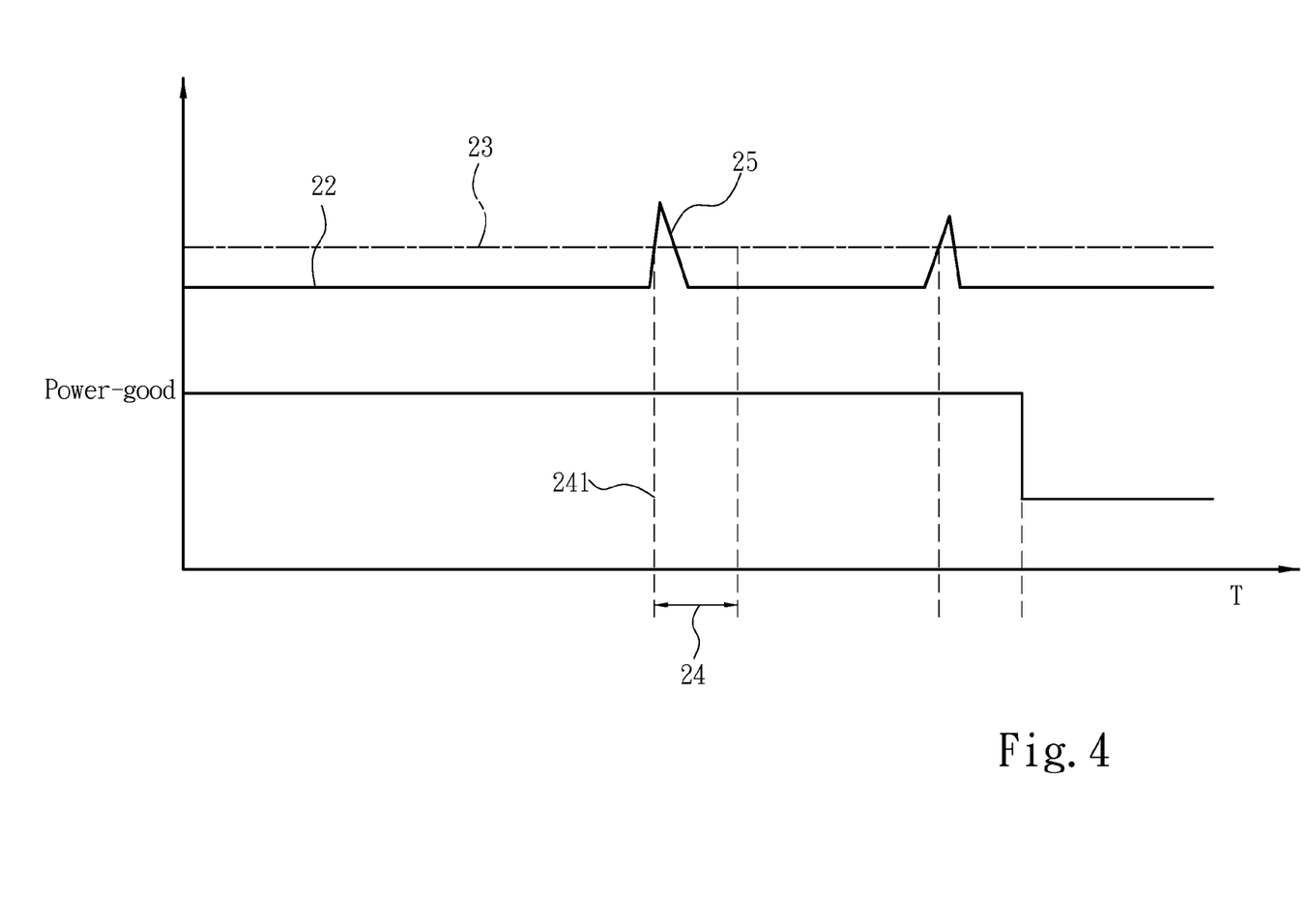
FIG. 4 is a timing diagram according to an embodiment of the present invention.

Referring to FIG. 2, the inrush current recording module 2 of the present invention includes a series circuit 20 and a detection recording unit 21. The series circuit 20 is formed by a capacitor 201 and a resistor 202. The series circuit 20 includes two ends thereof respectively connected to the first ground terminal 16 and the second ground terminal 17. The order of connecting the capacitor 201 and the resistor 202 in series can be adjusted according the application requirements or design. In one embodiment, the capacitor 201 includes two ends thereof respectively connected to the first ground terminal 16 and the resistor 202, and the resistor 202 includes two ends thereof respectively connected to the second ground terminal 17 and the capacitor 201. In another embodiment, the capacitor 201 includes two ends thereof respectively connected to the second ground terminal 17 and the resistor 202, and the resistor 202 includes two ends thereof respectively connected to the first ground terminal 16 and the capacitor 201. Further, the capacitor 201 provided solves an ElectroMagnetic Interference (EMI) issue that the operations of the power supply unit 1 generate.

The detection recording unit 21, which may be a micro controlling unit, detects voltages at the two nodes of the resistor 202 to generate a voltage signal 22. Further, the detection recording unit 21 detects the current flowing through the resistor 202, and converts the detected current according to the Ohm's law to the voltage signal 22 of the resistor 202. Further, in the present invention, the detection recording unit 21 may detect a voltage difference between two ends of the resistor 202 to generate the voltage signal 22. Further, the detection recording unit 21 may be written with a program language, and is predetermined with a voltage determination level 23 for comparing with the voltage signal 22. The voltage determination level 23 may be configured according to a maximum tolerable current of the power supply unit 1. More specifically, the voltage determination level 23 may be obtained from converting the maximum tolerable current of the power supply unit 1 and the resistance value of the resistor 202 according to the Ohm's law. In addition, the detection recording unit 21 is predetermined with an inspection period 24 through editing the program language. The inspection period 24 is triggered based on a triggering condition of the voltage signal 22 being greater than voltage determination level 23. That is to say, the inspection period 24 is a period timed from a timing starting point as a time point 241 at which the voltage signal 22 is greater than the voltage determination level 23. The duration of the inspection period 24 may be appropriately adjusted according to actual application requirements, and one second is taken as an example. Further, the detection recording unit 21 may be selected from the micro controlling unit with a built-in memory or the micro controlling unit connected to a flash memory, so as to allow the detection recording unit 21 to have a data recording function through editing the program language.

Referring to FIG. 2 to FIG. 5, during the process of power supply of the power supply unit 1, the capacitor 201 in the series circuit 20 suppresses the EMI that the circuits forming the power supply unit 1 generate. However, an inrush current 3 generated by an abnormal condition of the power power source 10 may flow in various directions into the power supply unit 1. For better explanation, one example is given for illustrations. When the inrush current 3 enters the power supply unit 1 from the external power source 10, the inrush current 3 passes through the front-stage power circuit of the power supply unit 1, enters the series circuit 20 via the first ground terminal 16 of the front-stage power circuit, and returns to the external power source 10 via the second ground terminal 17 connected to the series circuit 20. However, as the inrush current 3 passes through the series circuit 20, the current of the series circuit 20 is changed, meaning that the current flowing through the resistor 202 is also changed. The current of the resistor 202 is increased due to the inrush current 3. As such, the detection recording unit 21 that constantly performs voltage detection on the resistor 202 immediately generates another voltage signal 22 different from that corresponding to a normal condition, with the voltage signal 22 being greater than the voltage determination level 23. Thus, the detection recording unit 21 utilizes the time point 241 at which the voltage signal 22 is greater than the voltage determination level 23 as a starting timing point, and starts timing the inspection period 24. At this point, the detection recording unit 21 determines whether the power output signal Power_good that the power supply unit 1 generates can be obtained within the inspection period 24. If the detection recording unit 21 is unable to obtain the power output signal Power_good before the inspection period 24 ends, the detection recording unit 21 records the inrush current 3 as a harmful inrush current. A so-called harmful inrush current refers to the inrush current 3 that causes the power supply unit 1 to power abnormally and to be inoperable. On the other hand, if the detection recording unit 21 is still able to obtain the power output signal Power_good after the inspection period 24 ends, the detection recording unit 21 records the inrush current as a harmless inrush current. In other words, the harmless inrush current does not cause abnormal operations in the power supply unit 1. During the process of power supply of the power supply unit 1, the detection recording unit 21 records each inrush current 3, and categorizes the inrush current 3 as the harmful inrush current or the harmless inrush current. Thus, when maintenance staff later obtains recorded results of the detection recording unit 21, it may be determined whether a reason causing a malfunction of the power supply unit 1 is due to the harmful inrush current.

Again referring to FIG. 2 and FIG. 5, to prevent the power supply unit 1 from malfunctioning due to the harmful inrush current in a way that the detection recording unit 21 is unable to obtain power for sustaining operations and record the occurrence of each inrush current 3, in the present invention, the back-stage power circuit of the power supply unit 1 further includes a first power path that provides at least one of the operation power and a second power path that provides the standing power, and the inrush current recording module 2 is connected to the second power path in order to obtain the standing power for operations. Further, the inrush current recording module 2 further includes an energy storage capacitor 26. The energy storage capacitor 26 has a charging status in which the standing power is obtained and stored, and a discharging status in which the standing power cannot be obtained and power is outputted to the detection recording unit 21. More specifically, in the present invention, when the power supply unit 1 is powering normally and outputs the standing power, the energy storage capacitor 26 enters the charging status and stores a backup power. When the power supply unit 1 is affected by the harmful inrush current, and becomes of incapable or powering normally and stops outputting the standing power, the energy storage capacitor 26 immediately enters the charging status to output the standing power to the detection recording unit 21 to sustain the detection recording unit 21 for a period of time using the backup power. Thus, the detection recording unit 21 is allowed to reliably record the harmful inrush current. Further, to limit the backup power outputted from the energy storage capacitor 26 to be supplied to only the detection recording unit 21 and to prohibit the backup power from reverting to the second power path, the inrush current recording module 2 further includes a one-directional conducting element 27 connected to the second power path. In one embodiment, the one-directional conducting element 27 may be a diode.

Referring to FIG. 2, the detection recording unit 21 of the present invention includes two detection circuits 211 and 212, each of which connected to one end of the resistor 202. For example, the detection circuit 211 may be connected to a node connecting the resistor 202 and the capacitor 201, and the other detection circuit 212 may be connected to the node connecting the resistor 202 and the second ground terminal 17. However, the configuration of the detection circuits 211 and 212 may be correspondingly adjusted according to the configuration of the resistor 202. Further, the detection recording unit 21 further includes a first signal receiving circuit 213 that obtains the power output signal Power_good.

Figure 5:
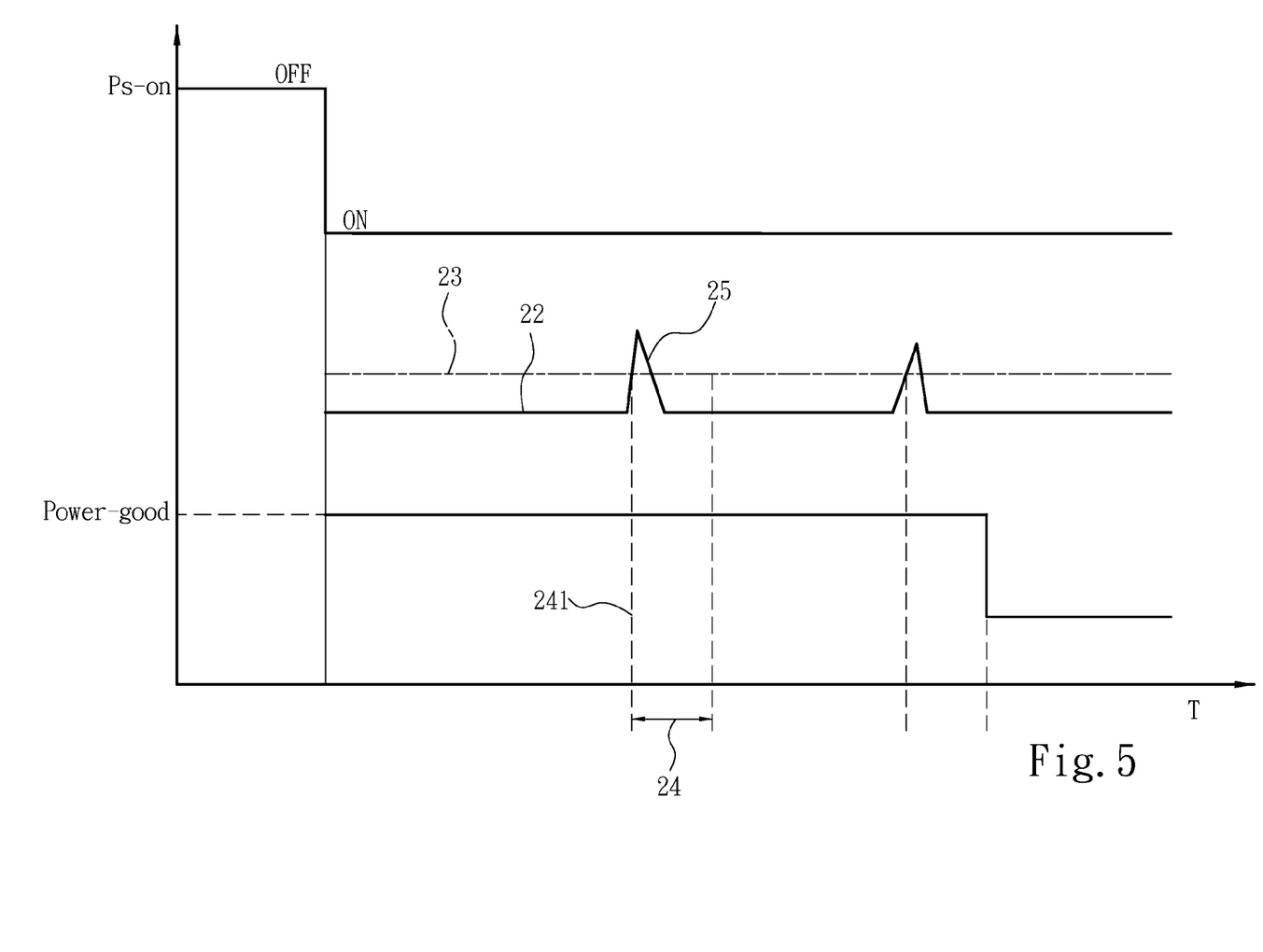
FIG. 5 is a timing diagram according to another embodiment of the present invention.

Referring to FIG. 2 and FIG. 5, the power supply unit 1 utilizes a power-on signal Ps_on provided by the external device as a power-on reference. That is to say, only when the power-on signal Ps_on is obtained from the external device, the power supply unit 1 is powered on to supply power and to output the operation power and the standing power. On the other hand, in the present invention, through editing the program language, the detection recording unit 21 may further have an enable condition of performing recording only when the power-on signal is obtained. That is to say, the detection recording unit 21 performs recording only when the power supply unit 1 is activated, so as to prevent power consumption caused by constant recording of the detection recording unit 21, and to record results that better reflect the powering process of the power supply unit 1. Further, the detection recording unit 21 includes a second signal receiving circuit 214 that receives the power-on signal Ps_on.

In conclusion, the inrush current recording module of the present invention is installed in a power supply unit, which includes a front-stage power circuit and a back-stage power circuit. The front-stage power circuit includes a first ground terminal, and the back-stage power circuit includes a second ground terminal. The inrush current recording module includes a series circuit and a detection recording unit. The series circuit is formed by a capacitor and a resistor, and includes two ends thereof respectively connected to the first ground terminal and the second ground terminal. The detection recording unit detects the resistor to generate a voltage signal, and compares the voltage signal with a voltage determination level. When the voltage signal is greater than the voltage determination level, the detection recording unit times an inspection period, and records a harmful inrush current or a harmless inrush current according to whether a power output signal is obtained within the inspection period. Accordingly, recorded results of the detection recording unit can be later read by maintenance staff to determine whether a malfunction of the power supply unit is caused by the harmful inrush current.

What is claimed is:

1. An inrush current recording module, installed in a power supply unit, the power supply unit comprising a transformer and having a front-stage power circuit and a back-stage power circuit that are divided by the transformer, the front-stage power circuit comprising a first ground terminal, the back-stage power circuit comprising a second ground terminal different from the first ground terminal, the power supply unit continuous outputting a power good signal when providing power in a normal condition, the inrush current recording module comprising:
- a series circuit, formed by a capacitor and a resistor, including two ends thereof respectively connected to the first ground terminal and the second ground terminal; and
- a detection recording unit, presetting a voltage determination level before detecting, and generating a voltage signal by detected two nodes of the resistor for comparing with the voltage determination level, the detection recording unit setting an inspection period which includes a timing starting point as a time point at which the voltage signal is greater than the voltage determination level, and
- the detection recording unit recording a harmful inrush current when the power good signal is not detected before the inspection period ends, and the detection recording unit recording a harmless inrush current when the power good signal is continuously detected after the inspection period ends.

2. The inrush current recording module of claim 1, wherein the back-stage power circuit of the power supply unit comprises a first power path that provides at least one operating power and a second power path that provides a standby power, the inrush current recording module is connected to the second power path to obtain the standby power for operations, the inrush current recording module further comprises an energy storage capacitor, the energy storage capacitor has a charging status in which the energy storage capacitor obtains the standby power and a discharging status in which the energy storage capacitor is unable to obtain the standby power and outputs power to the detection recording unit.

3. The inrush current recording module of claim 2, further comprising a one-directional conducting element connected to the second power path.

4. The inrush current recording module of claim 1, wherein the capacitor includes two ends thereof respectively connected to the first ground terminal and the resistor, and the resistor includes two ends thereof respectively connected to the second ground terminal and the capacitor.

5. The inrush current recording module of claim 4, wherein the detection recording unit comprises two detection lines each connected to one end of the resistor, and a first signal receiving line that obtains the power good signal.

6. The inrush current recording module of claim 5, wherein the power supply unit receives a power-on signal from an external device to become activated and to provide power, and the detection recording unit has an enable condition of performing recording only when the power-on signal is obtained.

7. The inrush current recording module of claim 6, wherein the detection recording unit comprises a second signal receiving line that receives the power-on signal (Ps_on).

8. The inrush current recording module of claim 1, wherein the detection recording unit comprises two detection lines each connected to one end of the resistor, and a first signal receiving line that obtains the power good signal.

9. The inrush current recording module of claim 1, wherein the power supply unit receives a power-on signal from a load which is connected with the power supply unit to become activated and to provide power, and the detection recording unit has an enable condition of performing recording only when the power-on signal is obtained.

10. The inrush current recording module of claim 9, wherein the detection recording unit comprises a second signal receiving line that receives the power-on signal.

* * * * *